United States Patent [19]

Tong et al.

[11] Patent Number: 5,181,031
[45] Date of Patent: Jan. 19, 1993

[54] METHOD AND APPARATUS FOR DECODING HUFFMAN CODES BY DETECTING A SPECIAL CLASS

[75] Inventors: Po Tong, Fremont; Peter Ruetz, Redwood City, both of Calif.

[73] Assignee: LSI Logic Corporation, Milpitas, Calif.

[21] Appl. No.: 737,620

[22] Filed: Jul. 30, 1991

[51] Int. Cl.$^5$ .............................................. H03M 7/40
[52] U.S. Cl. ......................................... 341/65; 341/67
[58] Field of Search .............................. 341/65, 67, 95

[56] References Cited

U.S. PATENT DOCUMENTS

| 3,883,847 | 5/1975 | Frank | 341/65 |
| 4,396,906 | 8/1983 | Weaver | 341/65 |
| 4,899,149 | 2/1990 | Kahan | 341/67 |

OTHER PUBLICATIONS

JPEG-9-R6: Working Draft for Development of JPEG CD, Jan. 14, 1991, CD 10918-1 Digital Compression and Coding of Continuous-tone Still Images.

Primary Examiner—Marc Hoff
Attorney, Agent, or Firm—Skjerven, Morrill, MacPherson, Franklin and Friel

[57] ABSTRACT

A structure and a method are provided for fast-decoding a Huffman code using a leading 1's detector for recognizing the number of leading 1's in the Huffman codeword up to a predetermined maximum, so as to provide a class number in accordance with the number of leading 1's recognized, a first logic circuit for providing a "remainder" by removing from the Huffman codeword a number of bits in accordance with the class number, and a second logic circuit for recognizing a special class. In one embodiment, decoding is accomplished by accessing a storage device using an address formed by a table number, a subclass number derived from the class number and all of the bits in the remainder except the least significant bit.

12 Claims, 3 Drawing Sheets

METHOD AND APPARATUS FOR DECODING HUFFMAN CODES BY DETECTING A SPECIAL CLASS

FIELD OF THE INVENTION

This invention relates to decoding of Huffman codes, and in particular relates to circuits for decoding Huffman codes.

DESCRIPTION OF RELATED ART

Huffman codes or codewords are space-efficient variable length binary representations of data. An example of Huffman code use is found in the "JPEG Digital Compression and Coding of Continuous-tone Still Images, Draft ISO 10918, 1991," by the Joint Picture Expert Group (JPEG) of the ANSI X3L2.8 committee. In Annex C of the JPEG document, JPEG specifies a particular way to generate Huffman code tables for use with entropy encoding of still pictures (see Annex C of ). Various circuits have been developed to decode Huffman codes. In general, these circuits either decode a Huffman code iteratively using sequential logic (i.e. one or two bits at a time, until the last bit of the code is recognized), or in parallel (i.e. decode the entire code in one clock period) using combinatorial logic. The latter method of decoding Huffman codes is known as "fast decoding."

One method in the prior art for fast decoding Huffman codes is illustrated in FIG. 1. As shown in FIG. 1, a circuit 100 is provided with an alignment buffer 101, a content-addressable memory (CAM) 102 and a random access memory (RAM) 103. The alignment buffer 101 receives a set of bits containing at least one Huffman code of length L, which lies anywhere within the W-bit input word ($L < = W$) on the terminals of bus 104. The width W of the alignment buffer 101's input word is the maximum width for which a Huffman codeword may be received by this circuit 100. Upon receiving the Huffman codeword, the alignment buffer 101 provides a W-bit output word at output bus 105. This output word on bus 105 is the input Huffman codeword shifted such that the first bit of the Huffman code is aligned to be the first bit of the output word on bus 105 from the alignment buffer 101. The location in CAM 102, which is addressed by the W bits on the bus 105, contains an n-bit address. This n-bit address is then used to address RAM 103 on bus 106. The size of RAM 103 is determined by the number of accepted Huffman codewords, which is between $2^{n-1}$ and $2^n$ in this example. The word in RAM 103 corresponding to the n-bit address on bus 106 contains both the length L and the decoded value of the Huffman code. The length L of the Huffman code thus decoded can then be fed back on the bus 107 to the alignment buffer 101 for aligning the next Huffman code contained in the input word on bus 104.

The approach taken by the prior art, e.g. in circuit 100 of FIG. 1, depends on the availability of an efficiently implemented CAM. CAMs are not readily available in some technologies. Without using a CAM, in order to achieve fast decoding, all the bits of a Huffman codeword would have to be used to address a RAM. The size of such a RAM is impractical and enormous.

SUMMARY OF THE INVENTION

A structure and a method are provided for fast-decoding a Huffman code using means for providing a class number in accordance with the number of leading 1's in the Huffman codeword, means for providing a "remainder" by removing from the Huffman codeword the leading 1's recognized, and except for one class, also the bit immediately following the leading 1's. The structure in accordance with the present invention includes means for storing a table of decoded Huffman codewords, in which the decoded values of accepted Huffman codewords are grouped according to their class numbers, except for a "special class". The special class is the class having the longest possible remainder. Such special class is stored as two smaller subclasses in the table of decoded values of Huffman codewords, according to whether a selected bit in the remainder is a '0' or '1'. For the purpose of accessing the table of decoded values, the table of decoded Huffman codewords is accessed using a subclass number and the remainder minus the selected bit. Except for the special class, the subclass number is the class number. In the case of the special class, the subclass number is either the class number or a number outside of the range of the class numbers.

In one embodiment, a random access memory (RAM) provides storage for a JPEG AC code table containing 162 Huffman codewords of no longer than 16 bits each. In accordance with the present invention, the Huffman code table is grouped into 0–10 classes, in accordance with the number of leading 1's in the Huffman codewords of each class. In this embodiment, class 6 is the designated special class. The decoded values of Class 6 are stored in two subclasses 6 and 11. Access to the decoded value of the Huffman code is by the subclass number and the higher order 6 bits of the remainder.

The present invention provides fast decoding of Huffman codes using a RAM of a size almost one-half of the RAM under another scheme for fast-decoding Huffman codewords described in a copending application. The present invention can be used even if content-addressable memories are not available. Thus, the present invention is amenable to an implementation in an integrated circuit for such application as image processing.

DETAILED DESCRIPTION OF THE PREFERRED EMBODIMENTS

Figure 1:
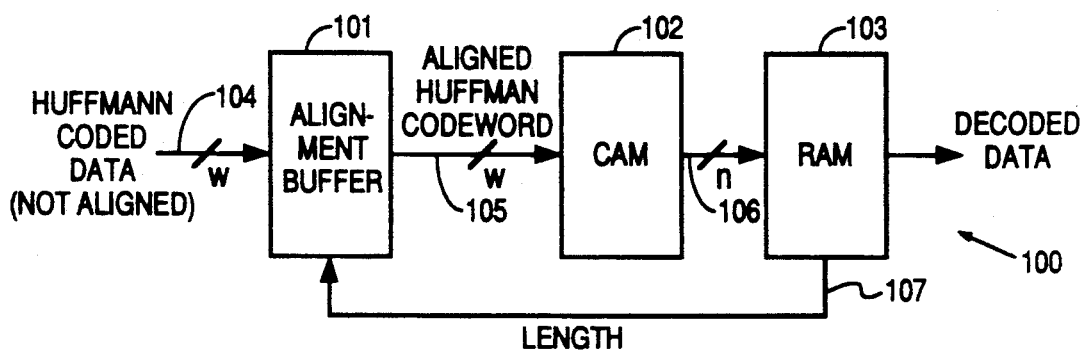
FIG. 1 is a block diagram of a circuit 100 in the prior art for fast decoding a Huffman code word.

A related invention is described with several embodiments in a copending application ("Copending Application") entitled "Method and Apparatus for Decoding Huffman Codes" by P. Ruetz and P. Tong, filed on the same day as the present invention, and assigned to LSI Logic Corporation, which is also the Assignee of the present Application, attorney docket number M-1584. The Copending Application is hereby incorporated by reference in its entirety.

The present invention is applicable to a class of Huffman codes which can be generated according to the procedure defined in Annex C of "JPEG Digital Compression and Code of Continuous-tone Still Images, Draft ISO 10918, 1991." Annex C of this JPEG document is hereby incorporated by reference in its entirety. In the following description, it is understood that the term "Huffman code" or "Huffman codeword" refers to Huffman code or Huffman codeword belonging to such class described by the procedure in Annex C of the JPEG document incorporated by reference above.

A circuit in accordance with the related invention described in the Copending Application decodes a Huffman codeword ("codeword") of up to a predetermined maximum length by first assigning the codeword into one of a number of classes according to the number of leading 1's in the binary representation of the codeword. In general, the codewords of a given maximum length can be assigned a class number ranging between 0 and $c-1$, in which the classes 0, 1, 2, ... $c-2$ respectively contain as members codewords having 0, 1, 2, ..., $c-2$ leading 1's. Class $c-1$ contains as members codewords having $c-1$ or more leading 1's. Once the class of a codeword is recognized, the leading 1's can be represented by a more compact class number, and are not needed for further decoding of the codeword. The bit immediately following the leading 1's is necessarily '0' in each class, except class $c-1$, where this bit can be either '1' or '0'. Consequently, for classes 0, 1, ..., $c-2$, this '0' bit following the leading 1's is also not necessary for further decoding of the Huffman codeword. Therefore, the circuit of the related invention derives a "remainder" by removing from the codeword, for the classes 0, 1, ..., $c-2$, both the leading 1's and the '0' bit immediately following the leading 1's. For the class $c-1$, the remainder is obtained by removing the $c-1$ leading 1's. In each class, the lengths of the remainders vary according to the set of Huffman codewords accepted. However, compact code tables can be achieved using both the class number and the remainder to form an address into a memory system. Because both the detection of leading 1's in the codeword and the memory access using the class number and the remainder can be readily achieved by combinational logic, the related invention also provides fast decoding of the Huffman codeword.

Under the method of the Copending Application, the size of the storage device necessary is provided by the product of the number of code tables, the number of classes, and $2^n$, where n is the length of the longest remainder.

Figure 2:
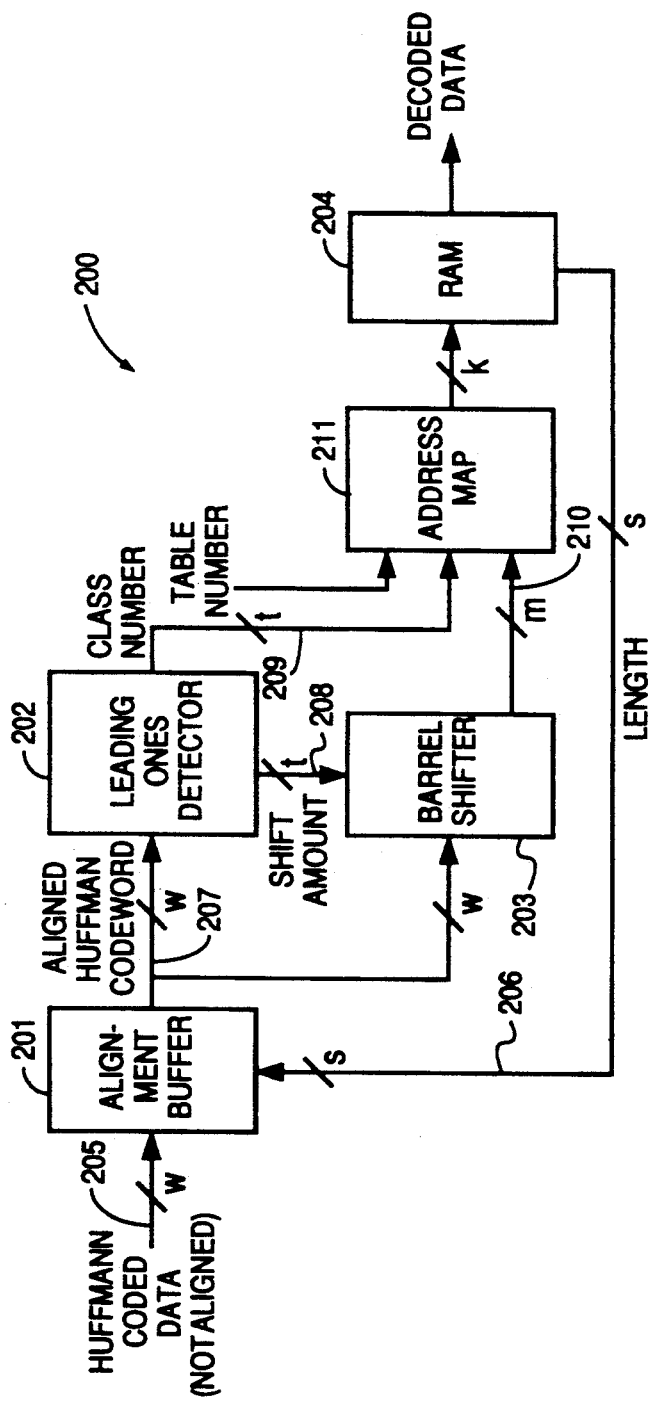
FIG. 2 is a block diagram of a circuit 200 for fast decoding of Huffman codeword, using leading 1's detector 202, barrel shifter 203.

FIG. 2 is a circuit implementing the fast decoding scheme described above. As shown in FIG. 2, an alignment buffer 201 receives on bus 205 a w-bit word, which includes a Huffman code word of no more than L bits long ($w \geq L$). Alignment buffer 201 aligns the Huffman codeword on bus 207 in accordance with a length specified on s-bit bus 206, such that the most significant bit on bus 207 is the most significant bit of the Huffman codeword. The quantity on bus 206 contains the length of the most recently decoded Huffman codeword. Leading 1's detector 202 receives the aligned w-bit word on bus 207 and provides both a t-bit class number on bus 209, and a shift amount on t-bit bus 208, where t is the smallest integer greater than or equal to $\log_2 c$. The shift amount, which ranges from 1 to $c-1$ (where c is the number of classes), is one more than the class number, except for class $c-1$, which is shifted by $c-1$ bits. Barrel shifter 203 receives the w-bit word on bus 207 and provides a m-bit output value on bus 210. This m-bit output value on bus 210 contains the remainder of the Huffman codeword on bus 207. The remainder is obtained by a shifting operation in accordance with the shift amount specified in t-bit bus 208. A random access memory (RAM) 204 is accessed using an address formed in address map 211 by the class number, the m-bit output value on bus 210 and a table number. For example, in a JPEG system, in which two JPEG Huffman "AC" code tables are used, the table number is specified by 1 bit. Besides the decoded value of the Huffman codeword, each entry in a code table also provide the length of the codeword decoded, this length is output on s-bit bus 206 to be fed back to the alignment buffer 201 to align the next Huffman codeword. Alignment buffer 201, leading 1's detector 202, barrel shifter 203 and RAM 204 can be implemented by any conventional or suitable circuits known in the art.

As can be seen from the circuit 200, under the method of the Copending Application, the size of the RAM necessary is provided by the product of the number of code tables (in this case, 2), the number of classes c, and $2^m$.

The present invention improves on the method of the Copending Application by reducing the size of the storage device.

As mentioned above, the lengths of remainders in each class vary. Sometimes, the longest possible remainder is attained in only one class (the "special" class). Under such condition, in accordance with the present invention, further reduction in the size of the memory system is possible. This is accomplished by dividing the special class into two subclasses. As a result of this division of the special class into two subclasses, decoding of a Huffman code in any class, other than the special class, can be accomplished using an address formed by the table number, the class number and a remainder having $m-1$ bits. For a Huffman code in the special class, a logic circuit determines which one of the two subclasses (each of membership size $2^{n-1}$), is looked up. Consequently, the size of the storage device required in accordance with the present invention is the product of the number of code tables, one more than the number of classes, and $2^{n-1}$. Hence, under this scheme for a set of Huffman codewords classifiable into much more than 2 classes, the size of storage device required for fast decoding can be substantially reduced from that required by the scheme described in the Copending Application.

Figure 3:
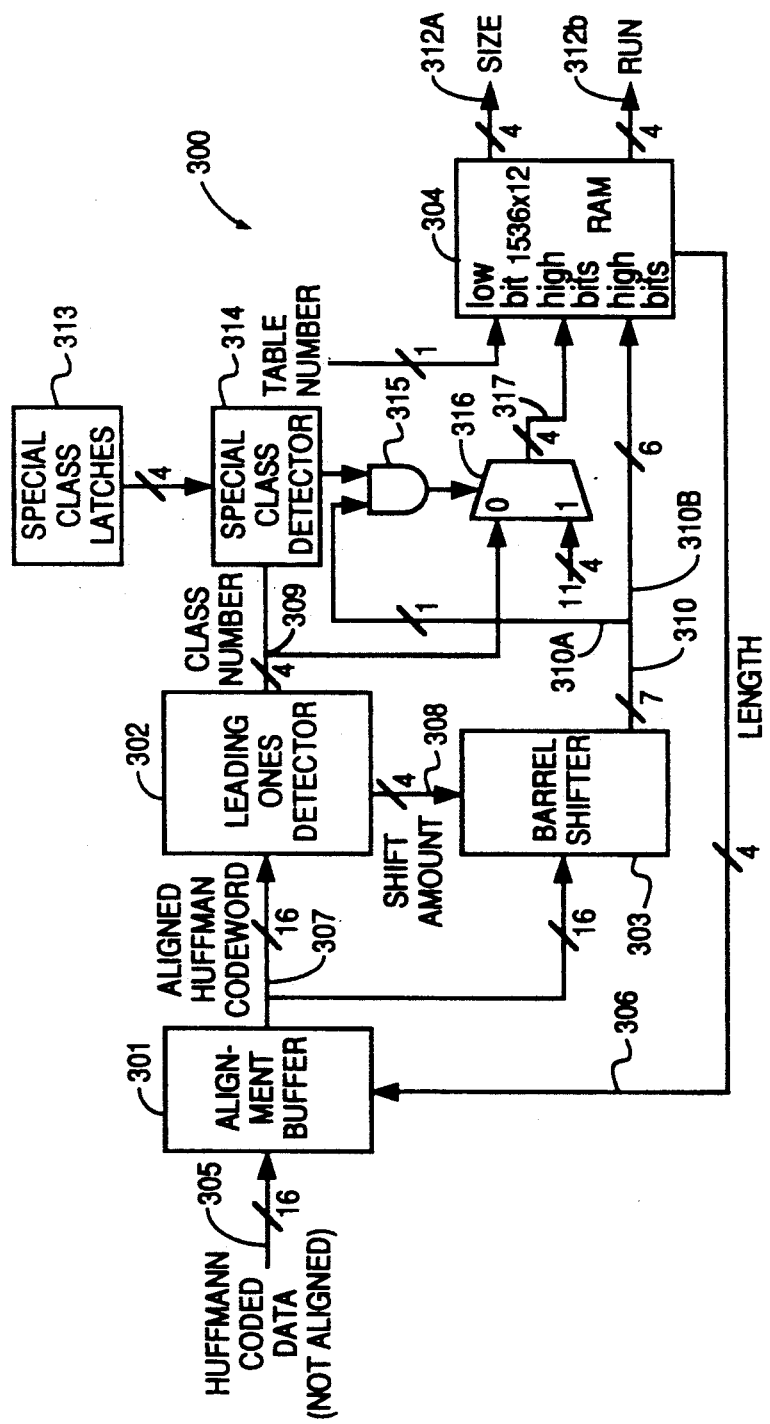
FIG. 3 is a block diagram of a circuit 300 for fast decoding of Huffman codewords, using leading 1's detector 302, barrel shifter 303, and special logic, in accordance with the present invention.

FIG. 3 shows an embodiment of the present invention in a circuit 300 suitable for decoding JPEG Huffman codewords. Each JPEG "AC" code table contains 162 Huffman codewords of less than 16 bits each. An example of a JPEG "AC" code table, with a possible classification into 11 classes, is provided below in Table 1:

TABLE 1

| | | |
|---|---|---|
| 00 | Class 0: | 0 leading 1's |
| 010 | | 5 codewords |
| 0110 | | |
| 01110 | | |
| 01111 | | |
| 10000 | Class 1: | 1 leading 1's |
| 10001 | | 8 codewords |
| 10010 | | |
| 10011 | | |
| 10100 | | |
| 10101 | | |
| 10110 | | |
| 10111 | | |
| 11000 | Class 2: | 2 leading 1's |
| 11001 | | 4 codewords |
| 11010 | | |
| 11011 | | |

TABLE 1-continued

| | | |
|---|---|---|
| 11100 | Class 3: | 3 leading 1's |
| 11101 | | 2 codewords |
| 11110 | Class 4: | 4 leading 1's |
| | | 1 codeword |
| 1111100 | Class 5: | 5 leading 1's |
| 11111010 | | 4 codewords |
| 111110110 | | |
| 111110111 | | |
| 111111000 | Class 6: | 6 leading 1's |
| 111111001 | | 9 codewords |
| 1111110110 | | |
| 11111101110 | | |
| 111111011110 | | |
| 1111110111110 | | |
| 11111101111110 | | |
| 11111101111111 | | |
| 11111110000000 | Class 7: | 7 leading 1's |
| 11111110000001 | | 64 codewords |
| 11111110000010 | | |
| ... | | |
| 11111110111111 | | |
| 11111111000000 | Class 8: | 8 leading 1's |
| 11111111000001 | | 32 codewords |
| 11111111000010 | | |
| ... | | |
| 11111111011111 | | |
| 11111111100000 | Class 9: | 9 leading 1's |
| 11111111100001 | | 16 codewords |
| 11111111100010 | | |
| ... | | |
| 11111111101111 | | |
| 11111111110000 | Class 10: | at least 10 leading 1's |
| 11111111110001 | | 17 codewords |
| 11111111110010 | | |
| ... | | |
| 11111111111110 | | |
| 111111111111110 | | |
| 1111111111111110 | | |

As can be seen from Table 1 that, for this set of Huffman codewords, the maximum number of binary bits in each class following the leading 1's is 7 bits (e.g. 7 bits is attained in class 6). In general, it is found that the number n of accepted Huffman codewords and the maximum possible number m of binary bits in the remainder satisfy the relationship:

$$2^m + m \leq n \leq 2^{m+1} + m$$

It is observed that, when decoding a codeword from a fixed-length bit pattern (e.g. on m-bit bus 210 of FIG. 2), the rightmost bit of the bit pattern can be either a '1' or '0', i.e. a "don't care" value, if the cordeword's remainder has a length less than the maximum-length remainder. Hence, for example, the possible bit patterns which can be encountered when decoding Class 6 Huffman codewords above can be classified into two "sub-classes" 6 and 11:

Class 6:
111111000xxxxx
111111001xxxxx
111111010xxxxx
1111110110xxxx
11111101110xxx
111111011110xx
1111110111110x
11111101111110
11111101111111

Sub-Class 6:
111111000xxxx0
111111001xxxx0
111111010xxxx0
1111110110xxx0

111111101110xx0
1111110111110x0
11111101111100
11111101111110
Sub-Class 11:
111111000xxxx1
111111001xxxx1
111111010xxxx1
1111110110xxx1
11111101110xx1
111111011110x1
11111101111101
11111101111111

As is apparent from the above, sub-class 6 consists of bit patterns of Class 6 codewords having as the least significant bit (or rightmost bit) a '0', and sub-class 11 consists of bit patterns of Class 6 codewords having as the rightmost bit a '1'. Hence, bit patterns encountered in decoding a codeword having a remainder of less than maximum length can be found in both sub-classes 6 and 11. For a codeword having a maximum-length remainder, the rightmost bit determines whether the codeword appears as a bit pattern in sub-class 6 or sub-class 11. For example 11111101111111 is found in sub-class 11, but not sub-class 6. It is observed that further decoding can be accomplished once the sub-class number, and the table number are recognized, only the remaining bits (the "sub-remainder"), which are one less than the bits in the maximum-length "remainder" defined above, are required. In this example, the number of remaining bits is 6. Consider then redefining the set of Huffman codes to be decoded according to the following scheme ("alternative scheme"): (a) each codeword, if not in the special class, is assigned to a sub-classes which bears a label numeral the same as that borne by the class to which the codeword belongs (i.e. each class, other than the special class, has a sub-class identical to itself); and (b) each codeword in the special class is represented in one or more bit patterns in one of two sub-classes defined in the manner illustrated above by sub-classes 6 and 11. Under this alternative scheme, using the example of the JPEG code table above, a codeword belonging to any of the Classes 0-5 or 7-9 is assigned to the corresponding one of sub-classes 0-5 and 7-9. However, a codeword belonging to Class 6 is represented in both sub-classes 6 and 11 of the special class, if the codeword does not have a maximum-length remainder. The codeword is represented uniquely in either sub-classes 6 and 11, according to the bit value of the right most bit, if the codeword has a maximum-length remainder. Under this alternative scheme, each codeword can be decoded by accessing a RAM using an address formed by the table number, the sub-class number and the sub-remainder, which is the maximum-length remainder minus the right most bit. The size of the RAM used in this alternative scheme is only slightly larger than one-half the size used in the scheme described in the Copending Application.

FIG. 3 show circuit 300 suitable for fast decoding Huffman codewords, in accordance with the present invention. As shown in FIG. 3, an alignment buffer 301 (similar to the alignment buffer 201 in FIG. 2), receives on 16-bit bus 305 a bit pattern containing the next Huffman code to be decoded. Alignment buffer 301 provides an aligned bit pattern on 16-bit bus 307 after aligning the input bit pattern on bus 305 in accordance with the length specified on 4-bit bus 306. The 16-bit aligned bit pattern on bus 307 is received into both leading 1's detector 302 and barrel shifter 303. Leading 1's detector 302 and barrel shifter 303 respectively provide the same function as leading 1's detector 202 and barrel shifter 303. Leading 1's detector 302 detects the number of leading 1's in the aligned bit pattern on bus 307 and provides both a shift amount on 4-bit bus 308 and a class number on 4-bit bus 309. The leading 1's detector 302 provides the 4-bit shift amount to barrel shifter 303 to derive the remainder of the instant Huffman codeword, by removing the leading 1's and, if the codeword is in class 0–9, the '0' bit following the leading 1's as well. A 7-bit output containing the remainder is thus provided by barrel shifter 303 on bus 310.

A special class latch 313 is provided to hold the class number of the special class. For example, in the JPEG "AC" Huffman code discussed above, the special class number is 6. A special class detector 314 compares the class number provided by leading 1's detector 302 on 4-bit bus 309 with the class number stored in the special class latch 313. If the class number on bus 309 is not the number of the special class, the class number is passed to RAM 304 on 4-bit bus 317 by multiplexer 316 as a subclass number. However, if the special class is detected, i.e. the class number o bus 309 corresponds to the special class, the least significant bit of the output value on bus 310 (this least significant bit is provided on lead 310$a$) is tested by AND gate 315 to determine which one of the two subclasses of the special class is selected. If the value on bus 310$a$ is a '0', the class number on bus 309 is also passed to RAM 304 on bus 317 by multiplexer 316 as the sub-class number. However, if the least significant bit of the value on bus 310$a$ is '1', the output value of AND gate 315 evaluates true, then multiplexer 316 provides the bit pattern '1011' (corresponding to sub-class 11) to RAM 304 on bus 317 as the sub-class number. An address is formed by the 1-bit table number, the 4-bit subclass number on bus 317, and the 6-bit sub-remainder on bus 310$b$ (i.e. the 6 higher bits of the 7-bit remainder on bus 310). Since the number of subclasses is not a power of 2, the subclass number forms the higher address bits of the RAM address.

Because there are two JPEG code tables, each having 12 sub-classes (0–11), RAM 304 is implemented by a RAM having $2*12*2^6 = 1536$ locations, which is slightly larger than one-half of the RAM ($2 \times 11 \times 2^7 = 2816$ locations) needed for decoding this set of Huffman codes under the scheme described in the Copending Application. Each word in RAM 304 includes 4-bit "size", "run length" and "length" quantities. The "size" and "run length" quantities are provided on 4-bit busses 312$a$ and 312$b$ respectively. The "length" quantity, which corresponds to the length of the Huffman codeword decoded, is fed back to alignment buffer 301 for aligning the next Huffman codeword. In circuit 300, the alignment buffer 301, leading 1's detector 302, barrel shifter 310, special class latch 313, special class detector 314 and RAM 304 can be implemented by convention or any circuit suitable for providing the functions described above.

The above detailed description is provided to illustrate specific embodiments of the present invention, and is not intended to be limiting. Many modifications and variations of the present invention are possible within the scope of the present invention. For example, use of other storage devices, such as programmable logic devices or read-only memory devices, are within the scope of the present invention. The present invention is defined by the following claims.

We claim:

1. A structure for decoding a Huffman codeword, said Huffman codeword having a length no longer than w bits, said structure comprising:
    a leading 1's detector for detecting a number c of leading 1's in said Huffman codeword up to a pre-determined maximum no more than w and for providing a class number equal to said number c;
    a first logic circuit receiving said number c and said Huffman code word for providing a remainder word of up to m bits, said remainder word being said Huffman codeword remaining after removing, for said class number less than said pre-determined maximum, c+1 bits, and for said class number equal to said predetermined maximum, c bits;
    means for dividing said remainder word into a special bit and a sub-remainder word portions;
    a second logic circuit receiving said special bit and said sub-remainder portions for providing a sub-class number, such that when said class number does not equal a special class number said subclass number is assigned said class number, and when said class number equals said special class number, said subclass number is assigned said special class number or a predetermined value, in accordance with the value of said special bit;
    means for storing decoded values of Huffman codewords; and
    address decoder for mapping an address comprising first and second fields, being respectively said sub-class number and said sub-remainder word, to a location in said storage means.

2. A structure as in claim 1, wherein said first logic circuit comprises a barrel shifter.

3. A structure as in claim 1, wherein said storing means comprises a random access memory.

4. A structure as in claim 3, wherein said address decoder comprises means for decoding said address for said random access memory.

5. A structure as in claim 4, wherein the bits in said sub-remainder word form the lower order address bits of said random access memory.

6. A structure as in claim 1, wherein said means for storing contains a plurality of tables holding decoded values of Huffman codewords, said means for storing further receives a signal indicating which one of said tables is in use.

7. A method for decoding a Huffman codeword, said Huffman codeword having a length no longer than w bits, said method comprising the steps of:
    using a leading 1's detector to detect a number c of leading 1's in said Huffman codeword up to a pre-determined maximum no more than w and for providing a class number equal to said number c;
    using a first logic circuit to provide a remainder word, said remainder word being said Huffman codeword remaining after removing, for said class number less than said pre-determined maximum, c+1 bits, and for said class number equal to said predetermined maximum, c bits;
    dividing said remainder word into a special bit and a sub-remainder word portions;
    using a second logic circuit to provide a subclass number, such that when said class number does not equal a special class number said subclass number is assigned said class number, and when said class number equals said special class number, said sub-class number is assigned said special class number or a predetermined value, in accordance with the value of said special bit;

providing means for storing decoded values of Huffman codewords; and providing an address decoder for mapping an address having first and second fields, being respectively said sub-class number and said sub-remainder word, to a location in said storage means.

8. A method as in claim 7, wherein said step of using a first logic circuit to provide a remainder word comprises the step of using a barrel shifter.

9. A method as in claim 7, where in said step of providing storing means comprises the step of providing a random access memory.

10. A method as in claim 9, wherein said step of providing an address decoder comprises the step of decoding said address for said random access memory.

11. A method as in claim 10, wherein the bits in said sub-remainder word form the lower order address bits of said random access memory.

12. A method as in claim 7, wherein said step of providing means for storing comprises the step of storing a plurality of tables containing decoded values of Huffman codewords, said step of storing further comprising the step of receiving a signal indicating which one of said tables is in use.

* * * * *